United States Patent [19]

Held

[11] Patent Number: 4,599,128

[45] Date of Patent: Jul. 8, 1986

[54] PROCESS AND APPARATUS FOR THE CONTINUOUS PRODUCTION OF METAL-CLAD LAMINATES

[76] Inventor: Kurt Held, Alte Strasse 1, 7218 Trossingen 2, Fed. Rep. of Germany

[21] Appl. No.: 673,305

[22] Filed: Nov. 20, 1984

[30] Foreign Application Priority Data

Nov. 25, 1983 [DE] Fed. Rep. of Germany ....... 3342678

[51] Int. Cl.⁴ .............................................. B32B 31/12
[52] U.S. Cl. ..................................... 156/322; 156/324; 156/583.5; 219/469; 432/228
[58] Field of Search ........................... 29/447; 53/425; 156/322, 324, 583.5; 219/469; 422/26; 432/228

[56] References Cited

U.S. PATENT DOCUMENTS 4,225,376  9/1980  Berg ................................. 156/322 X
4,336,096  6/1982  Dedekind ..................... 156/583.5 X Primary Examiner—Robert A. Dawson Attorney, Agent, or Firm—Neuman, Williams, Anderson & Olson

[57] ABSTRACT

The invention relates to a process and apparatus for the continuous production of metal-clad laminates, in particular, for the manufacture of electric printed circuit boards, consisting of an electrically insulating core layer and a metal foil covering one or both surfaces of this layer, wherein the metal foil unwound from a supply roll and pre-heated is bonded in a dual-belt press under the influence of pressure and heat to the core layer. In order to obtain an immaculate laminate surface, provision is made for the metal foil to be pre-heated while it is still wound on the supply roll. The source of the pre-heating of the metal foil is a heatable core of the supply roll, the pre-heated metal foil on entering the dual-belt press is pressed against the press belt of the press, and the metal foil supply roll and the region of the foil which is pressed against the press belt are arranged in a common clean air area.

19 Claims, 4 Drawing Figures

PROCESS AND APPARATUS FOR THE CONTINUOUS PRODUCTION OF METAL-CLAD LAMINATES

The invention relates to a process for the continuous production of metal-clad laminates, in particular, for the manufacture of electric printed circuit boards, consisting of an electrically insulating core layer and a metal foil covering one or both surfaces of this layer, wherein the metal foil unwound from a supply roll and pre-heated is bonded in a dual-belt press under the influence of pressure and heat to the core layer. The invention furthermore relates to an apparatus for performing such a process comprising a dual-belt press and a metal foil supply roll.

Metal-clad laminates, in particular, for the manufacture of etched printed circuit boards, must be manufactured with a surface which after the pressing is completely free of foreign matter indentations, resin residues, scratches and other surface damages which might impair the purpose of the metal cladding, namely that of presenting, after the etching of the conductive pattern, uninterrupted tracks which are insulated from one another and exhibit reproducible electric values.

It is known (German Offenlegungsschrift No. 3,307,057) to continuously manufacture such laminates on dual-belt presses. In this case, the delivered metal foil is pre-heated by being placed against a hot press belt of the dual-belt press before it is bonded to the core layer. A uniform heating of the metal foil to the prescribed temperature is, however, obviously not attained thereby since thermal distortions make the metal foil wrinkle as it enters the press, which substantially impairs the quality of the surface of the laminate. With generic processes and apparatus, it has furthermore not yet been possible to safely exclude contamination of the metal foils by dust originating from the core layer or the environment. In order to counteract this, elaborate clean air systems, suction exhaust devices involving high heating costs and special protective clothing which is cumbersome to the operator have hitherto proven necessary.

The object underlying the invention is to improve the surface quality of metal-clad laminates and in so doing to primarily avoid thermal distortions and also keep the surface free of impurities.

The object is attained in accordance with the invention in that the metal foil is pre-heated while it is still wound on the supply roll, which is preferably effected by the pre-heating of the metal foil being performed by a heatable core of the supply roll. It is particularly expedient for the pre-heated metal foil on entering the dual-belt press to be pressed against the press belt of the press, more particularly, preferably in the region of a deflection drum of the press. In order to exclude contamination, provision is made for the heated metal foil supply roll and the region of the foil which is pressed against the press belt to be arranged in a common clean air area. The metal foil may furthermore be drawn in a laterally wrinkle-free manner on the press belt.

In an apparatus according to the invention, the metal foil is pressed against the press belt either directly by the supply roll or by a deflection roller arranged between supply roll and press belt. In such an apparatus it has furthermore proven very important to provide stripping devices for removal of foreign matter from press belt and metal foil.

The following description of preferred embodiments with reference to the appended drawings serves to explain the invention in greater detail.

Figure 1:
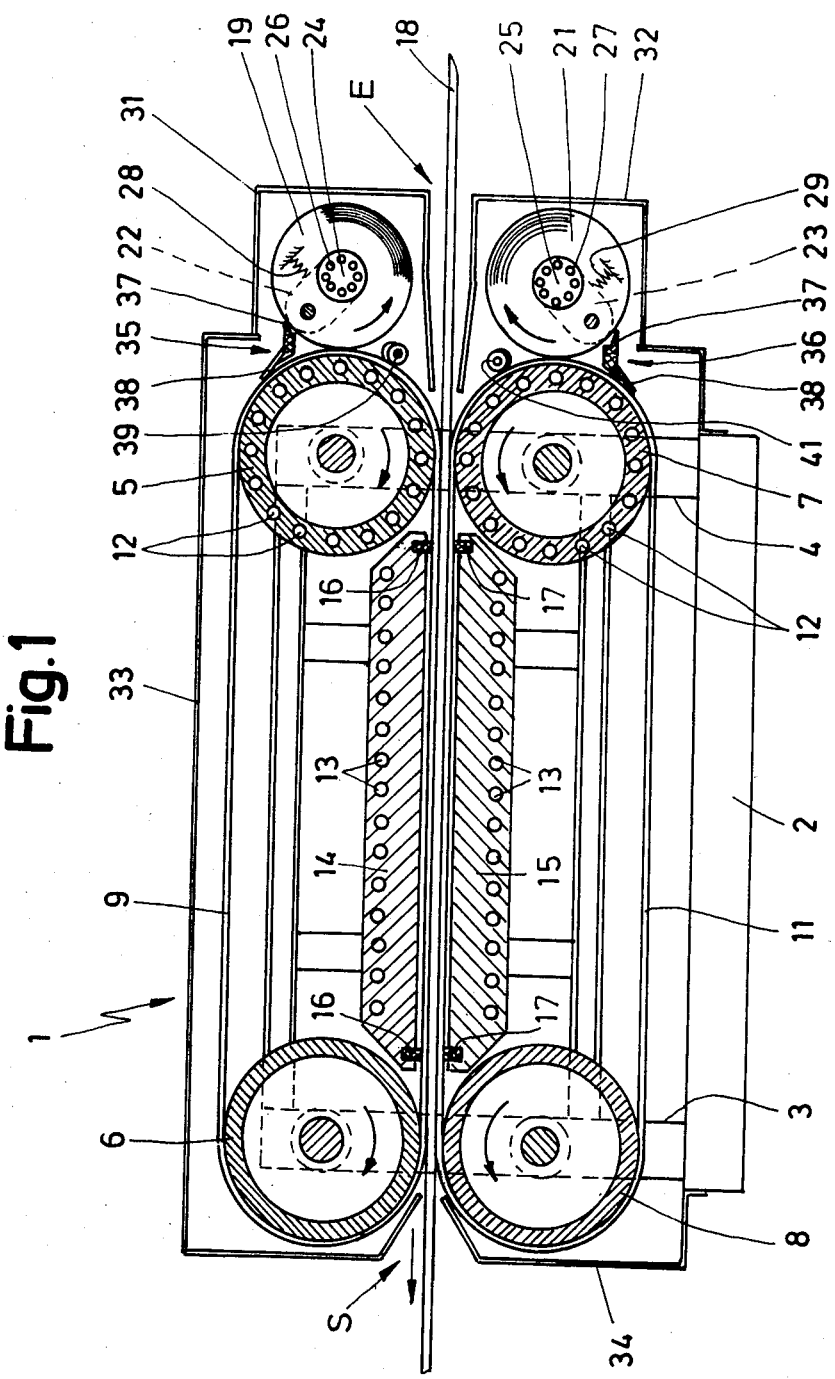
FIG. 1 shows a schematic sectional view of a dual-belt press comprising metal foil supply rolls for the continuous manufacture of metal-clad laminates.

The dual-belt press 1 illustrated schematically in FIG. 1 includes a machine frame with a base plate 2 and two vertical uprights 3, 4 protruding from the base plate 2. Mounted for rotation on the uprights 3, 4 are four deflection drums 5, 6, 7, 8. An endless press belt 9 and 11, respectively, preferably consisting of metal, extends around the drums 5, 6 and 7, 8, respectively. The deflection drums 5, 7 on the inlet side are heatable, for example, by lines 12 for a heat-emitting medium extending inside the drum jacket. The heat from the drums 5, 7 transfers to the press belts 9, 11. The deflection drums 6, 8 on the outlet side are driven in the direction of the arrows and take the press belts 9, 11 along with them. Arranged in the interior of the press belts 9, 11 are pressure plates 14 and 15, respectively, which are supported by the machine frame and are heated, for example, by heating pipes 13. Disposed on the surface of these pressure plates 14, 15 facing the respective press belt inside are self-contained seals 16 and 17, respectively, which grind against the press belt inside and delimit an area for the introduction of a preferably hydraulic pressure medium. It is thereby possible for heat and pressure to simultaneously act on a web of material advanced between the press belts 9, 11.

In the apparatus illustrated in FIG. 1, an electrically insulating core layer 18 is delivered as web of material at the inlet side E of the dual-belt press. This core layer consists, for example, of synthetic resin impregnated paper which may be strengthened by reinforcement fibers, in particular, glass fibers. The core layer 18 is drawn off from a supply roll which is not illustrated.

In front of the deflection drums 5, 7 on the inlet side, supply rolls 19, 21 for thin metal foil, in particular, copper foil, are each pivotally mounted on arms 22, 23. The supply rolls each comprise one core 24, 25 mounted for rotation on the arms 22, 23, with the web of metal foil wound thereon. When the apparatus is in operation, the metal foil runs from the supply rolls 19, 21 rotating in the direction of the arrows, in the region of the deflection drums 5, 7 onto the press belt 9 and 11, respectively, is taken along by the latter, is placed onto the core layer 18 and as it passes through the dual-belt press 1 is bonded under the influence of pressure and heat to this layer, so that there finally exits at the outlet side S of the apparatus a laminate which is metal-clad on either side, with the metal foils being intimately joined to the core layer. If a separating foil in the center of the core layer 18 is carried along through the apparatus, and the laminate is separated at this separating foil after leaving the dual-belt press, two laminates which are metal-clad on one side are obtained. Both rotatable cores 24, 25 of the supply roll 19, 21 are braked so that the metal foil must be drawn off from the supply roll with a certain pretension.

As already mentioned at the outset, it is of decisive importance in the manufacture of immaculate metal-clad laminates to prevent thermal distortions in the metal foil to be applied (as a result of differing thermal expansions). In order to attain this, the metal foil must be uniformly pre-heated, more particularly, preferably to the temperature of the press belts 9, 11. It has been ascertained that a simple, space-saving way of pre-heating the metal foil is to heat the cores 24, 25, for example, by electrical resistance heatings or heating pipes arranged in the cores, which is indicated in FIG. 1 by the reference numerals 26, 27. Within the supply roll, the individual layers of the metal foil are snugly superimposed, which ensures good thermal conductivity contact. In this way, a completely uniform heating of the respective uppermost metal foil layer running off the roll to the desired temperature is obtained.

The pre-heating temperature of the metal foil may be controlled in dependence upon the press belt temperature. It is also possible to control the pre-heating temperature of the cores 24, 25 in dependence upon the temperature of the respective uppermost metal foil layer running off the supply roll.

It has furthermore been ascertained that it is important to press the pre-heated metal foil on entering the dual-belt press against the press belt in order to avoid wrinkle formation. In the embodiment according to FIG. 1, this is effected by the pivot arms 22, 23 supporting the supply roll 19, 21 being pressed with a certain force in the region of the deflection drums 5, 7 against the press belt, with the deflection drums 5, 7 acting as abutments. The pressing force may be gained from energy storing means which are indicated schematically by springs 28, 29 in FIG. 1.

In order to prevent the intrusion of impurities into the metal-clad laminate it is important to seal the metal foil, in particular, at the inlet side of the apparatus. In the apparatus according to FIG. 1, this is effected by a casing 31, 32 which directly adjoins a casing 33 and 34, respectively, of the press belt 9, 11 and seals off the entire supply roll 19, 21 including the place at which the metal foil presses against the press belts from the environment. Optimal protection is thereby ensured in a space-saving manner.

For the further prevention of intrusion of any foreign matter, strippers 35, 36 engaging both one side of the delivered metal foils and the press belts are provided. Engaging the metal foils is preferably an elastic lip 37, consisting, for example, of rubber, while a peeling blade 38 at an angle which is as acute as possible scrapes off any resin residues from the press belt. The aforementioned parts 37, 38, as is apparent from FIG. 1, may be joined to form a continuous channel. Foreign matter reaching this channel after removal from the metal foil or the press belt may be guided out of the casings 31, 32 by a solvent or flushing agent. After appropriate filtration, the solvent or flushing agent may be used again.

Finally, friction rolls 39, 41 may be arranged in the region of the deflection drums 5, 7 where they engage the metal foils deposited on the press belts 9, 11 and draw these in a laterally wrinkle-free manner. The design and arrangement of these friction rolls will be described hereinafter.

The strippers 35, 36 are urged in a conventional manner with a certain pressure against the surfaces to be cleaned. Since in the embodiment according to FIG. 1, the diameter of the supply roll 19, 21 constantly decreases, there is associated with the strippers 35, 36 in a manner known per se a follow-up device which ensures that the lip 37 always snugly engages the uppermost metal foil layer of the supply roll.

Figure 2:
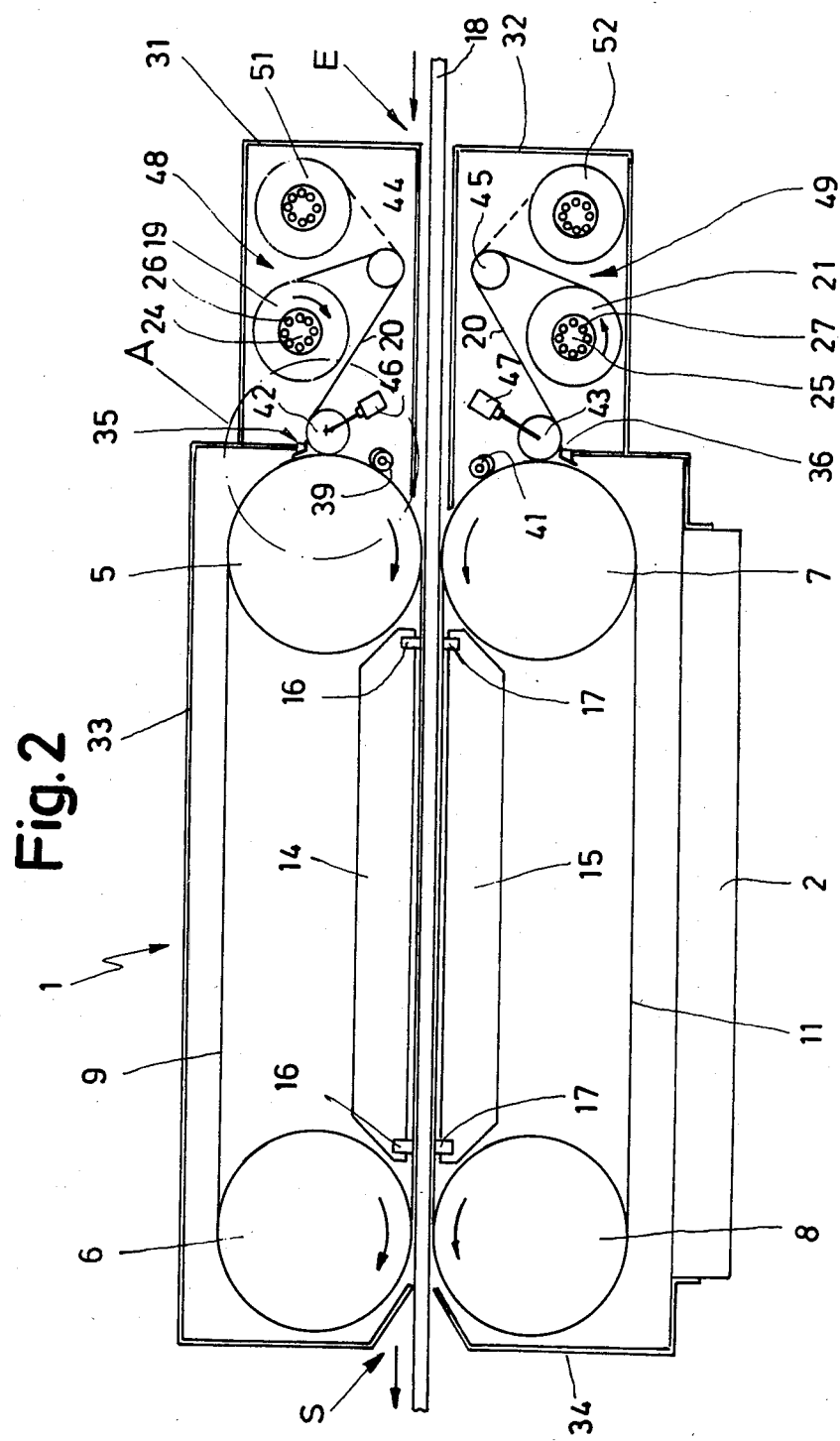
FIG. 2 shows a modified embodiment of an apparatus for the manufacture of metal-clad laminates.

In the modified embodiment of the invention depicted in FIG. 2, the design of the dual-belt press 1 is illustrated merely by the most important contour lines. Corresponding parts in FIGS. 1 and 2 are designated by the same reference numerals. The main difference between the apparatus shown in FIGS. 1 and 2 is that in FIG. 2 the metal foil 20 does not run directly from the supply rolls 19, 21 onto the press belts 9, 11 and is not pressed by these rolls against the press belts. Instead of this, a deflection roller 42 and 43, respectively, is arranged between supply roll and press belt. The metal foil 20 is drawn off from the supply rolls 19, 21 via a further deflection roller 44 and 45, respectively, guided over the deflection rollers 42, 43 and pressed by the latter in the region of the deflection drum 5, 7 of the dual-belt press 1 against the press belt 9 and 11, respectively. This eliminates the problem of the constantly decreasing diameter of the supply roll 19, 21. In the arrangement according to FIG. 2, the cores of the supply roll 19, 21 are also heated and ensure uniform heating of the delivered metal foil 20. Energy storing means, for example, in the form of piston-cylinder-units 46, 47 engage the deflection rollers 42, 43 and ensure that the metal foils are uniformly pressed against the press belts. The supply rolls 19, 21 and the deflection rollers 42, 43 are again arranged in a clean air area 48 and 49, respectively, encapsulated by a casing 31 and 32, respectively. The clean air areas 48, 49 furthermore comprise standby supply rolls 51, 52 for metal foil. These supply rolls are employed when the supply rolls 19, 21 are used up. Strippers 35, 36 are also provided again for removal of impurities from the metal foil and the press belt.

Figure 3:
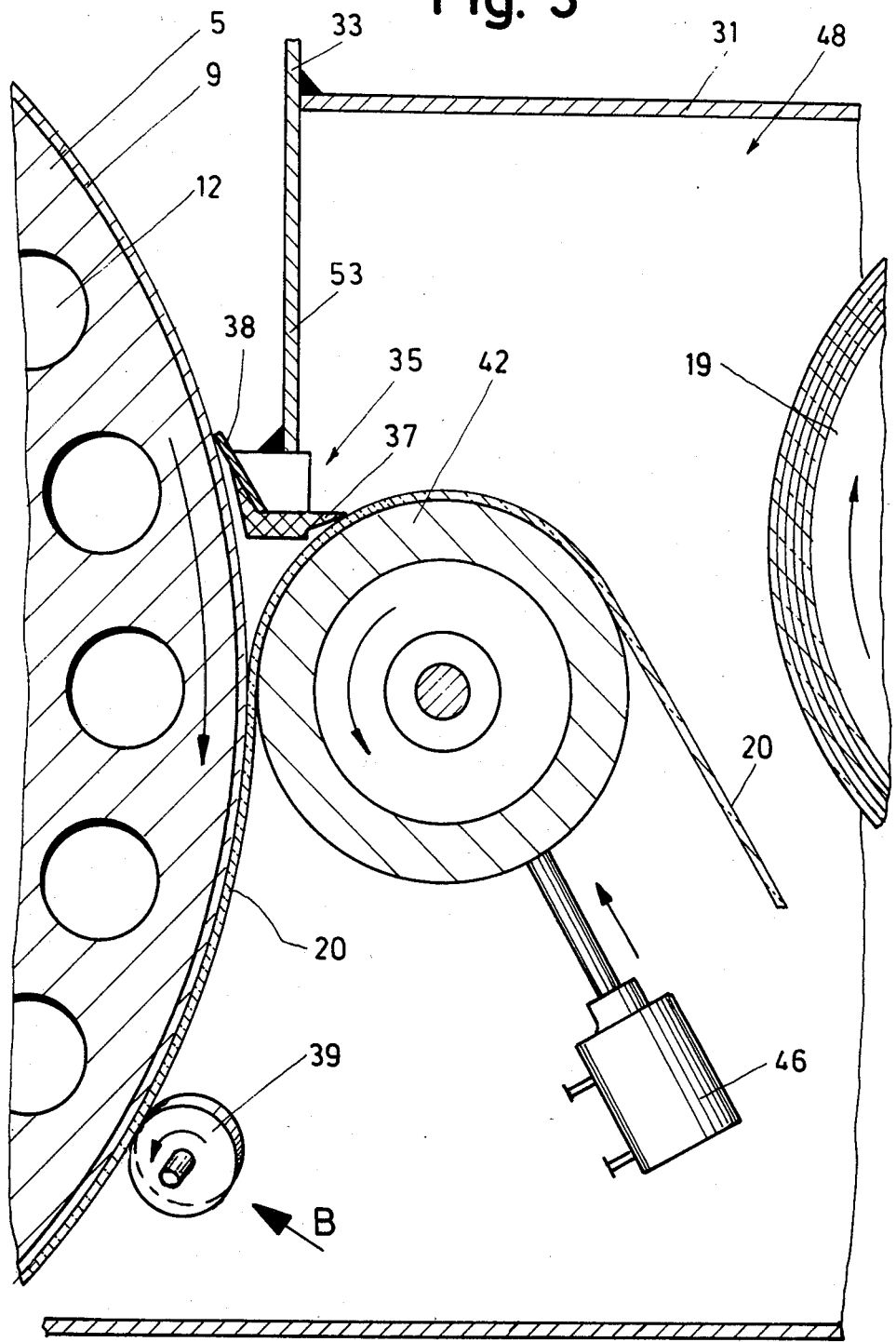
FIG. 3 shows an enlarged individual view of the area A in FIG. 2.

In comparison to FIG. 2, FIG. 3 is a strongly enlarged illustration of the arrangement of the stripper 35 and the deflection roller 42. The stripper 35 again consists of an elastic lip 37 engaging the metal foil 20 and of a peeling blade 38 which is firmly connected thereto and engages the press belt 9. Since the deflection roller 42 and the deflection drum 5 constitute appropriate abutments for the lip 37 and the blade 38, these stripping devices can engage the respective surfaces with substantial pressure, which improves the cleaning effect. The lip 37 and the blade 38 again form a channel which is closed at the end and from which foreign matter may be removed by, for example, a flushing solution.

As is apparent from FIG. 3, the stripper 35 is arranged directly at the free edge of a common wall 53 of the casings 31 and 33. In this way, the stripper 35 simultaneously acts as seal for these casings in the inlet area of the metal foil 20.

Figure 4:
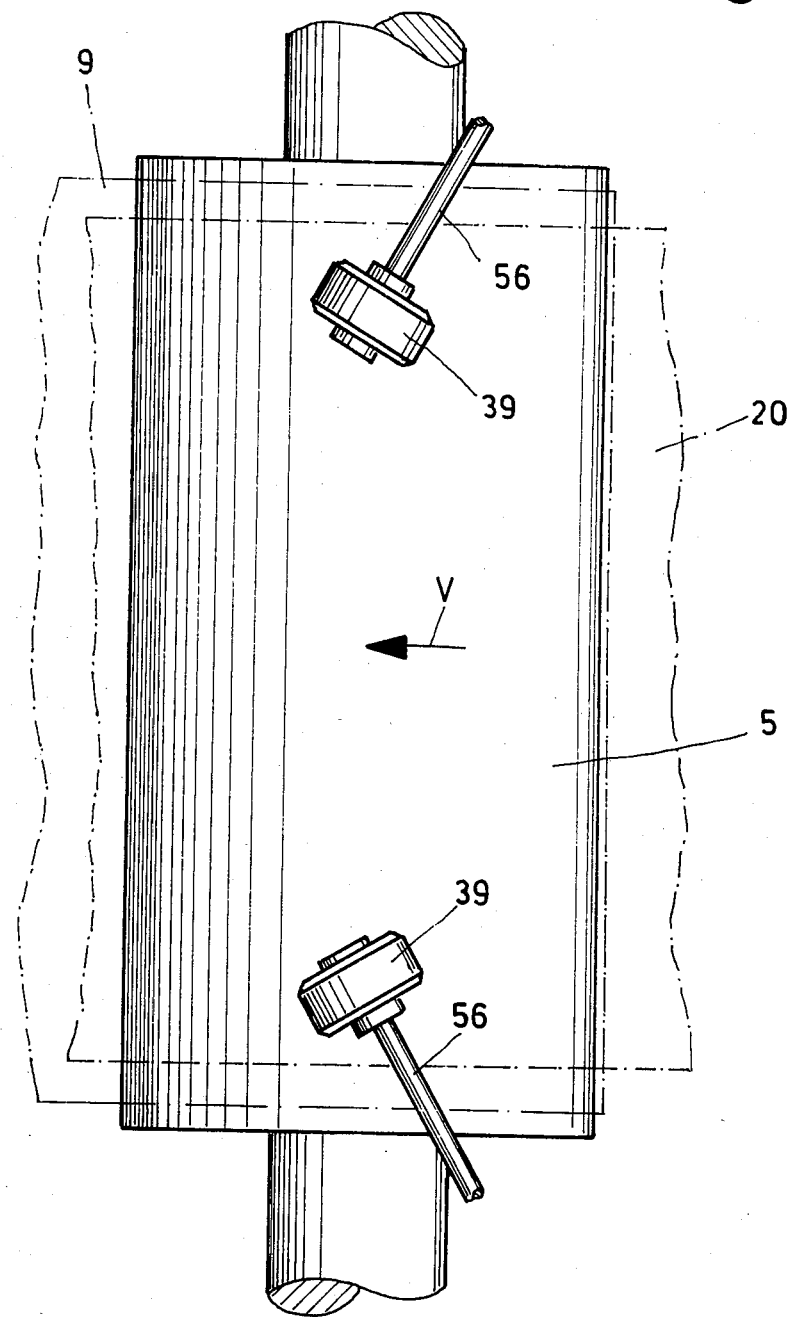
FIG. 4 shows a further individual view of the apparatus in the direction of the arrow B in FIG. 3.

FIG. 4 shows how the aforementioned friction rolls 39 engage the metal foil 20 in the region of the deflection drum 5. The axes 56 extend obliquely to the direction of advance V of the metal foil 20 so that the friction rolls 39 engaging the foil produce a force component which is directed respectively towards the edge of the foil and by means of which the foil is drawn in a laterally wrinkle-free manner.

In the embodiments of the invention illustrated and described herein, the metal foil supply rolls 19, 21 are arranged at the inlet side E of the apparatus. In modified embodiments, these supply rolls together with their accessories could also be arranged in a corresponding manner at the outlet side S. The pre-heated metal foil is thereby deposited under pressure in the region of the deflection drums 6, 8, respectively, at the outlet side, onto the press belts 9, 11 and guided by these belts to the inlet side E. Since, in this case, the metal foil rests for a lengthy time on the press belts before being united with the core layer 18, a particularly intimate temperature and heat exchange can be effected between press belt and metal foil. It is also possible to deposit the preheated metal foil on the strand of the press belts 9, 11 stretched out between the deflection drums at the top and bottom, respectively.

In yet again other embodiments of the invention, wherein a peeling off of resin residues is not so important, the peeling blade 38 may likewise be replaced by a lip made of rubber or another elastic material. This lip is again preferably integrally connected to the lip engaging the metal foil and may form a channel therewith. It is also possible to allow peeling blades to act in a stripping manner at the press belt and elastic lips at a place spatially separate therefrom.

What is claimed is:

1. A process for the continuous production of metal-clad laminates, such as a printed circuit boards comprising an electrically insulating layer having opposed main surfaces, and a metal foil applied to at least one of said main surfaces, comprising the steps of preheating the metal foil wound on a supply roll by means of a heatable core in such supply roll; unwinding the preheated foil from such supply roll and bonding such preheated foil to said insulating layer in a dual-belt press by means of heat and pressure.

2. The process of claim 1 in which the preheating temperature of the metal foil is controlled in dependence upon the press belt temperature of the dual-belt press.

3. The process of claim 1 in which the preheating temperature of the core of the supply roll is controlled in dependence upon the temperature of a metal foil layer unwound from the supply roll.

4. The process of claim 1, 2 or 3, in which the preheated metal foil on entering the dual-belt press is pressed against a press belt of the press.

5. The process of claim 4 in which said press belts are rotatably mounted on guide rollers and the preheated metal foil is urged against a press belt portion disposed about a guide roller.

6. The process of claim 1, 2, or 3 in which the heated metal foil supply roll and the area of the metal foil which is pressed against the press belt are disposed in a common clean air area.

7. The process of claim 1, 2 or 3 in which the metal foil is drawn outwardly along opposed lateral edge portions so as to avoid wrinkles in such metal foil in the course of passing through said dual-belt press.

8. Apparatus for the production of metal-clad laminates such as printed circuit boards, comprising a dual-belt press for bonding by heat and pressure a metal foil layer unwound from a supply roll to at least one surface of a core layer which is fed with said foil layer between belts of said press, the improvement comprising a supply roll of said metal foil having a core with heating means disposed therein for preheating said metal foil prior to feeding the same between the belts of said press.

9. The apparatus of claim 8 in which the supply roll is pivotally mounted and is in combination with means for biasing said roll against a press belt of said dual-belt press whereby the delivered metal foil engages such press belt under pressure.

10. The apparatus of claim 8 in combination with a deflection roller arranged between the supply roll and a press belt for pressing the delivered metal foil against a press belt.

11. The apparatus of claim 8, 9 or 10 in combination with strippers mounted in said apparatus for scraping engagement with moving surfaces of said press belt and metal foil and removal of foreign matter from said surfaces.

12. The apparatus of claim 11 in which the strippers are arranged within a clean air area in the region of an inlet gap defined by the metal foil and a press belt.

13. The apparatus of claim 11 in which the stripper scraping engagements with the press belt and the metal foil constitute seals preventing entry of the ambient atmosphere into the clean air area.

14. The apparatus of claim 11 in which the strippers are in the form of elastic lips.

15. The apparatus of claim 11 in which the stripper engaging the press belt is in the form of a peeling blade.

16. The apparatus of claim 11 in which the strippers engaging the press belt and the metal foil are joined to form a channel, and the scraped off foreign matter is removable from the channel by a flushing agent.

17. The apparatus of claim 11 in which the press belts are rotatably mounted on spaced guide rolls, deflection rollers urge the metal foil against a press belt portion moving over a guide roll, and the strippers engage under pressure a press belt and metal foil, respectively, in the region of a deflection roller.

18. Apparatus for the production of metal-clad laminates such as printed circuit boards, comprising a dual-belt press having opposed belts movable about guide rolls for bonding a core layer by heat and pressure to a preheated metal foil layer unwound from a supply roll and fed with said core layer between the opposed belts of such press, and opposed spreading rolls rotatably mounted with axes of rotation obliquely disposed to the axis of metal foil movement through said press for frictional engagement with opposed lateral edge portions of a metal foil layer and spreading the opposed, engaged foil layer portions apart while such foil layer is moving over one of said press guide rolls whereby wrinkles are prevented in said foil layer in the course of passing through said press.

19. The apparatus of claim 18 in which the supply roll urges the metal foil under pressure against a press belt and is arranged at one end of the dual-belt press.

* * * * *